(12) United States Patent
Sato

(10) Patent No.: US 6,750,654 B2
(45) Date of Patent: Jun. 15, 2004

(54) MAGNETIC RESONANCE IMAGING APPARATUS

(75) Inventor: Kenji Sato, Tokyo (JP)

(73) Assignee: GE Medical Systems Global Technology Company, LLC, Waukesha, WI (US)

(*) Notice: Subject to any disclaimer, the term of this patent is extended or adjusted under 35 U.S.C. 154(b) by 0 days.

(21) Appl. No.: 10/378,204

(22) Filed: Mar. 3, 2003

(65) Prior Publication Data

US 2003/0169044 A1 Sep. 11, 2003

(30) Foreign Application Priority Data

Mar. 5, 2002 (JP) .......................... 2002-058861

(51) Int. Cl.[7] .................................................. G01V 3/00
(52) U.S. Cl. ......................................... 324/318; 324/322
(58) Field of Search ................................ 324/318, 322, 324/300, 306, 307, 309, 312, 314

(56) References Cited

U.S. PATENT DOCUMENTS

| | | |
|---|---|---|
| 4,695,801 A | 9/1987 | Arakawa et al. |
| 4,703,274 A | 10/1987 | Kaufman et al. |
| 4,707,664 A | 11/1987 | Fehn et al. |
| 4,857,846 A | 8/1989 | Carlson |
| 5,461,314 A | 10/1995 | Arakawa et al. |
| 5,565,779 A | 10/1996 | Arakawa et al. |
| 5,663,645 A * | 9/1997 | Kaufman et al. ........... 324/318 |
| 6,100,693 A * | 8/2000 | Eberler et al. .............. 324/318 |
| 6,249,121 B1 * | 6/2001 | Boskamp et al. ........... 324/318 |
| 6,259,251 B1 * | 7/2001 | Sugiura et al. ............. 324/318 |
| 6,424,154 B1 | 7/2002 | Young |

* cited by examiner

Primary Examiner—Louis Arana
(74) Attorney, Agent, or Firm—Carl B. Horton, Esq.; Armstrong Teasdale LLP

(57) ABSTRACT

For the purposes of improving stability of an RF system, improving efficiency of cooling, and fully retaining an examination region in an MRI apparatus, a lower first-direction RF coil and an upper first-direction RF coil are connected to form a first-direction electromagnetic wave transmitting/receiving section, and a lower second-direction RF coil and an upper second-direction RE coil are connected to form a second-direction electromagnetic wave transmitting/receiving section, so that the phase of electromagnetic waves in two orthogonal directions is controlled by a 2-channel phase control section. Moreover, coil elements for the RF coils are disposed inside an examination region, control devices are disposed outside the examination region, and cooling sections are disposed near the control devices.

11 Claims, 6 Drawing Sheets

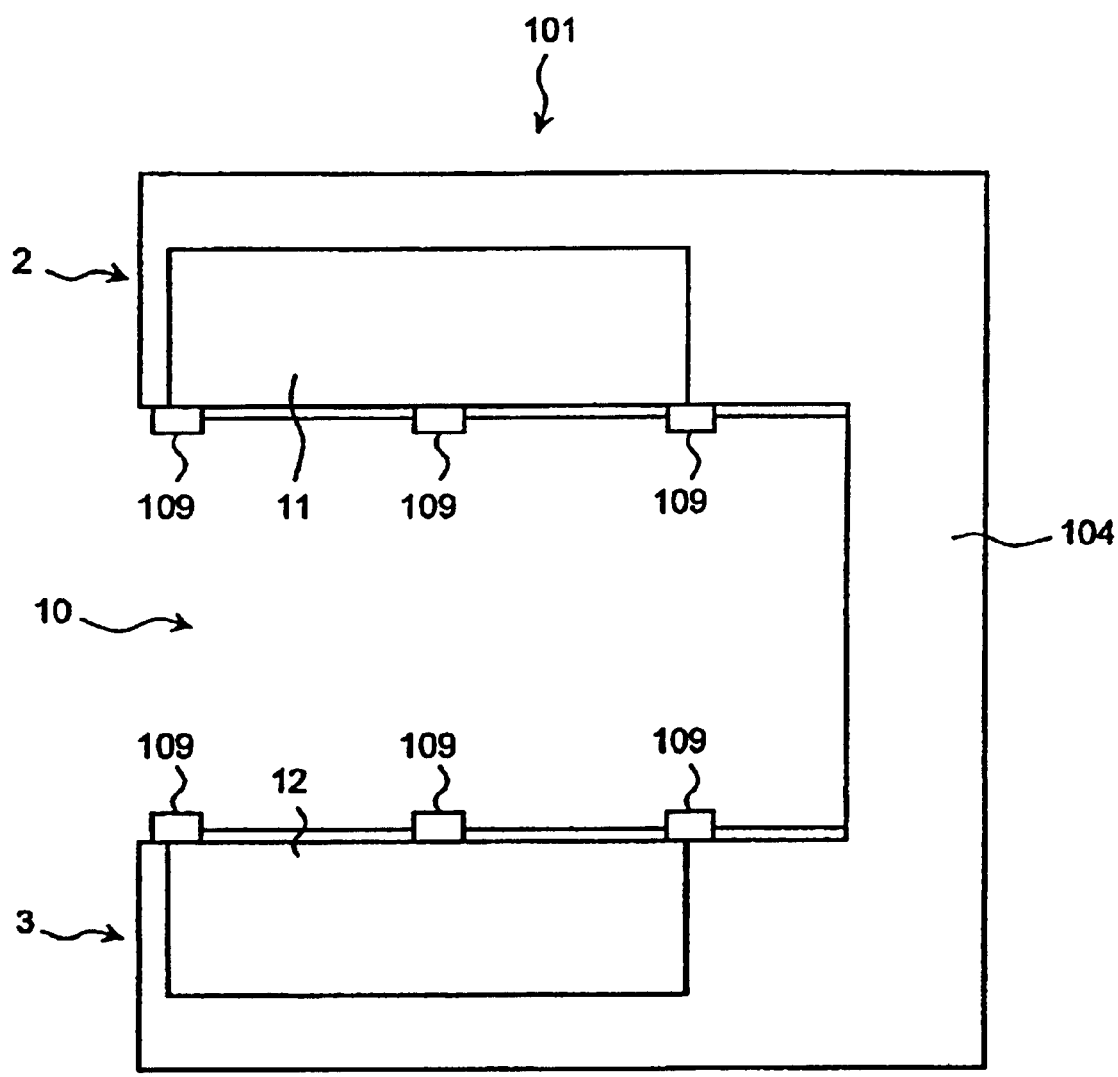

MAGNETIC RESONANCE IMAGING APPARATUS

CROSS REFERENCE TO RELATED APPLICATIONS

This application claims the benefit of Japanese Application No. 2002-058861 filed Mar. 5, 2002.

BACKGROUND OF THE INVENTION

The present invention relates to a magnetic resonance imaging apparatus in which an examination region is established by a first magnetic field generating section and a second magnetic field generating section disposed facing each other, and a magnetic resonance image of a subject placed within the examination region is captured, and more particularly to a magnetic resonance imaging apparatus in which stable operation is achieved, control devices are efficiently cooled, and the examination region can be maximized, with a simple configuration.

A magnetic resonance imaging apparatus ("MRI apparatus" hereinbelow) that uses a nuclear magnetic resonance phenomenon to image the internal structure of a subject to be imaged is known. Since the nuclear magnetic resonance phenomenon is harmless to a living body, the MRI apparatus is useful especially for medical applications, and is used for diagnosis of brain tumor, etc.

The nuclear magnetic resonance phenomenon is a phenomenon wherein, in a substance subjected to a uniform static magnetic field, spins of nuclei of atoms constituting the substance align in the same direction and absorb and emit electromagnetic waves at a frequency proportional to the static magnetic field strength (which frequency will be referred to as a "resonance frequency" hereinbelow). The MRI apparatus can utilize the nuclear magnetic resonance phenomenon for a specific nuclear species (mainly hydrogen atoms) to image an arbitrary cross-sectional plane through the subject to be imaged in an arbitrary thickness.

In imaging the internal structure of the subject to be imaged using the nuclear magnetic resonance phenomenon, a gradient magnetic field, aside from the static magnetic field, that varies with space and time is applied to the subject to be imaged to measure spatial information. By applying the gradient magnetic field, the magnetic field applied to the subject to be imaged is differentiated with position, and the resonance frequency of atoms constituting the subject to be imaged varies with position. Thus, which atoms exist at which position in the subject to be imaged can be known by applying the gradient magnetic field and measuring the resonance frequency. Up to this point, the mechanism of imaging the internal structure of an object by the MRI apparatus has been described.

FIG. 4 is an explanatory diagram for explaining an overall configuration of an MRI apparatus in the prior art, and FIG. 5 is an explanatory diagram for explaining RF coils disposed in the MRI apparatus shown in FIG. 4. FIG. 6 is a vertical cross-sectional view of the MRI apparatus shown in FIG. 4. In FIGS. 4, 5 and 6, the MRI apparatus 101 establishes an examination region 10 using a lower magnetic field generating section 103, which is a first magnetic field generating section, and an upper magnetic field generating section 102, which is a second magnetic field generating section, disposed facing each other; and the MRI apparatus 101 generates a static magnetic field and a gradient magnetic field in the examination region 10 by an upper magnetic field coil 11 inside the upper magnetic field generating section 102 and a lower magnetic field coil 12 inside the lower magnetic field generating section 103.

Moreover, a lower first-direction RF coil 121 that generates electromagnetic waves in a predefined direction (B1 direction hereinbelow) and a lower second-direction RF coil 131 that generates electromagnetic waves in a second direction orthogonal to the B1 direction (B2 direction hereinbelow) are disposed on the upper surface of the lower magnetic field generating section 103. Similarly, an upper first-direction RF coil 141 that generates electromagnetic waves in the B1 direction, and an upper second-direction RE coil 151 that generates electromagnetic waves in the B2 direction are disposed an the lower surface of the upper magnetic field generating section 102. The MRI apparatus 101 emits electromagnetic waves of frequencies in a certain range toward the examination region 10 using the lower first-direction RF coil 121, lower second-direction RF coil 131, upper first-direction RF coil 141 and upper second-direction RF coil 151, and receives electromagnetic waves radiated from atoms constituting the subject to be imaged by the nuclear magnetic resonance phenomenon. In such a configuration, the lower first-direction RF coil 121, lower second-direction RF coil 131, upper first-direction RE coil 141 and upper second-direction RF coil 151 are each made by connecting a plurality of control devices 109 with a coil element. The control devices 109 are for stabilizing the phase of electromagnetic waves transmitted by the coil element and for switching between transmission and reception of electromagnetic waves. The control devices 109 are disposed on the surfaces of the upper magnetic field generating section 102 and the lower magnetic field generating section 103.

The lower first-direction RF coil 121 is connected to RE wiring 122. The lower first-direction RF coil is supplied with electric power from the RF wiring 122 when transmitting electromagnetic waves and sends received electromagnetic waves via the RF wiring 122 when receiving electromagnetic waves. The lower second-direction RF coil 131 is connected to RF wiring 132. The lower second-direction RF coil 131 is supplied with electric power from the RF wiring 132 when transmitting electromagnetic waves and sends received electromagnetic waves via the RF wiring 132 when receiving electromagnetic waves. Similarly, the upper first-direction RF coil 141 transmits/receives electromagnetic waves via RF wiring 142, and the upper second-direction RF coil 151 transmits/receives electromagnetic waves via RF wiring 152.

Moreover, the RF wiring 122 and RF wiring 142 are disposed along a post 104, one of two posts 104 and 105 that support the upper magnetic field generating section 102, and the wiring 122 and wiring 142 are connected to a phase control section 106. Similarly, the RF wiring 132 and wiring 152 are disposed along the post 105, and are connected to the phase control section 106. The phase control section 106 controls the phase of the RF wiring 122, 132, 142 and 152 to thereby control the phase of electromagnetic waves transmitted/received by the lower first-direction RF coil 121, lower second-direction RF coil 131, upper first-direction RF coil 141, and upper second-direction RF coil 151.

In the MRI apparatus 101, the lower first-direction RF coil 121 and upper first-direction RF coil 141 generate an electromagnetic field in the B1 direction in the examination region 10, and the lower second-direction RF coil 131 and upper second-direction RF coil 151 generate an electromagnetic field in the B2 direction. By thus generating electromagnetic fields in two orthogonal directions in the examination region 10, uniform electromagnetic waves can be generated inside the examination region 10 with high excitation efficiency, and also accuracy of reception of electromagnetic waves from the examination region 10 can be made uniform.

Additionally, the phase control section 106 controls the phase of electromagnetic waves to avoid coupling between electromagnetic waves in the B1 direction and those in the B2 direction. The phase control section 106 is implemented using a 4-channel phase control section, for example, a QHD (quadrature hybrid drive), because the phase of the four RF coils of the lower first-direction RF coil 121, lower second-direction RF coil 131, upper first-direction RF coil 141 and upper second-direction RF coil 151 must be controlled.

Thus, the conventional MRI 101 is implemented as an MRI apparatus in which accuracy of transmission and reception of electromagnetic waves inside the examination region 10 is made uniform by providing RF coils of the B1 and B2 directions using four RF coils, and high accessibility to the examination region 10 is obtained by disposing the posts 104 and 105 not facing each other with respect to the examination region 10.

The conventional MRI apparatus 101, however, requires a 4-channel phase control section for controlling the phase of the four RF coils. Therefore, phase control is complicated and it is difficult to stably operate the RF coils. Moreover, in the conventional MRI apparatus 101, the control devices 109 for the RF coils disposed on the lower surface of the upper magnetic field generating section 102 and on the upper surface of the lower magnetic field section 103 reduce the space of the examination region 10. Particularly, since each control device has a thickness of the order of 10 mm, the control device reduces the space of the examination region 10 by 20 mm.

Furthermore, the control devices generate heat during operation, and the generated heat adversely affects a magnetic resonance image by generating ghosts and the like. In addition, the subject to be imaged is a living body in medical examination, which is the main application of the MRI apparatus, and it is undesirable for a heat generating element to be located nearby. However, since the control devices are positionally distributed, cooling means is difficult to install, and the cooling means further reduces the examination region.

That is, the conventional MRI apparatus poses problems that phase control is complicated and unstable, control devices reduce the examination region, and cooling of the control devices is difficult.

SUMMARY OF THE INVENTION

Therefore, an object of the present invention is to provide a magnetic resonance imaging apparatus in which stable operation is achieved, control devices are efficiently cooled, and an examination region can be maximized, with a simple configuration.

To solve the aforementioned problems and to attain the object, the present invention, in accordance with a first aspect, is a magnetic resonance imaging apparatus in which an examination region is established by a first magnetic field generating section and a second magnetic field generating section disposed facing each other, and a magnetic resonance image of a subject placed within said examination region is captured, said apparatus characterized in comprising: a first-direction electromagnetic wave transmitting/receiving section for transmitting/receiving electromagnetic waves in a predefined first direction inside said examination region; a second-direction electromagnetic wave transmitting/receiving section for transmitting/receiving electromagnetic waves in a second direction different from said first direction inside said examination region; and a phase control section for controlling the phase of electromagnetic waves transmitted/received by said first-direction electromagnetic wave transmitting/receiving section and the phase of electromagnetic waves transmitted/received by said second-direction electromagnetic wave transmitting/receiving section.

According to the invention of the first aspect, the first-direction electromagnetic wave transmitting/receiving section for transmitting/receiving electromagnetic waves in a first direction and the second-direction electromagnetic wave transmitting/receiving section for transmitting/receiving electromagnetic waves in a second direction are controlled by a 2-channel control section, whereby the configuration of an electromagnetic wave transmitting/receiving section is simplified.

The present invention, in accordance with a second aspect, is, in the invention of the first aspect, characterized in that said first-direction electromagnetic wave transmitting/receiving section comprises a first first-direction RF coil provided near said first magnetic field generating section and a second first-direction RF coil provided near said second magnetic field generating section, and said second-direction electromagnetic wave transmitting/receiving section comprises a first second-direction RF coil provided near said first magnetic field generating section and a second second-direction RF coil provided near said second magnetic field generating section.

According to the invention of the second aspect, a first first-direction RF coil and a second first-direction RF coil are connected to form the first-direction electromagnetic wave transmitting/receiving section, and a second first-direction RF coil and a second second-direction RF coil are connected to form the second-direction electromagnetic wave transmitting/receiving section, whereby phase control of electromagnetic waves in two directions is conducted by a 2-channel phase control section.

The present invention, in accordance with a third aspect, is, in the invention of the first or second aspect, characterized in that said first first-direction RF coil, said second first-direction RF coil, said first second-direction RF coil, and said second second-direction RF coil each comprises a plurality of control devices for stabilizing the phase in each coil and a coil element for connecting said plurality of control devices, and are each made by disposing said coil element inside said examination region and disposing said plurality of control devices outside said examination region.

According to the invention of the third aspect, control devices for stabilizing the phase of the RF coils are disposed outside the examination region, whereby only the coil element is disposed inside the examination region.

The present invention, in accordance with a fourth aspect, is, in the invention of the third aspect, characterized in comprising a cooling section near said plurality of control devices for cooling said plurality of control devices.

According to the invention of the fourth aspect, control devices for stabilizing the phase of the RF coils are disposed together outside the examination region, and a cooling section is provided for cooling these control devices.

The present invention, in accordance with a fifth aspect, is, in the invention of the first-fourth aspects, characterized in that said first direction and said second direction are orthogonal to each other.

According to the invention of the fifth aspect, electromagnetic waves in a first direction transmitted/received by the first-direction electromagnetic wave transmitting/receiving section and electromagnetic waves in a second direction transmitted/received by the second-direction electromagnetic wave transmitting/receiving section are orthogonalized to achieve uniform accuracy of transmission/reception of electromagnetic waves in the examination region.

The present invention, in accordance with a sixth aspect, is, in the invention of the first-fifth aspects, characterized in that said first magnetic field generating section is positioned near a floor, and said second magnetic field generating section is supported by a single post.

According to the invention of the sixth aspect, the second magnetic field generating section is supported by a single post.

The present invention, in accordance with a seventh aspect, is, in the invention of the sixth aspect, characterized in that said first direction and said second direction are parallel to the floor.

According to the invention of the seventh aspect, first electromagnetic waves and second electromagnetic waves are generated in a direction parallel to the floor.

The present invention, in accordance with an eighth aspect, is, in the invention of the sixth or seventh aspect, characterized in that said phase control section is provided at said post.

According to the invention of the eighth aspect, the phase control section for controlling the phase of first and second electromagnetic waves are provided at the post for supporting the second magnetic field generating section.

The present invention, in accordance with a ninth aspect, is, in the invention of the sixth-eighth aspects, characterized in that said cooling section is provided at said post.

According to the invention of the ninth aspect, the cooling section for cooling the control devices is provided at the post for supporting the second magnetic field generating section.

Further objects and advantages of the present invention will be apparent from the following description of the preferred embodiments of the invention as illustrated in the accompanying drawings.

BRIEF DESCRIPTION OF THE DRAWINGS

FIG. 6 is a vertical cross-sectional view of the MRI apparatus shown in FIG. 4.

DETAILED DESCRIPTION OF THE INVENTION

An MRI apparatus in accordance with one embodiment of the present invention will now be described in detail with reference to the accompanying drawings.

Figure 1:
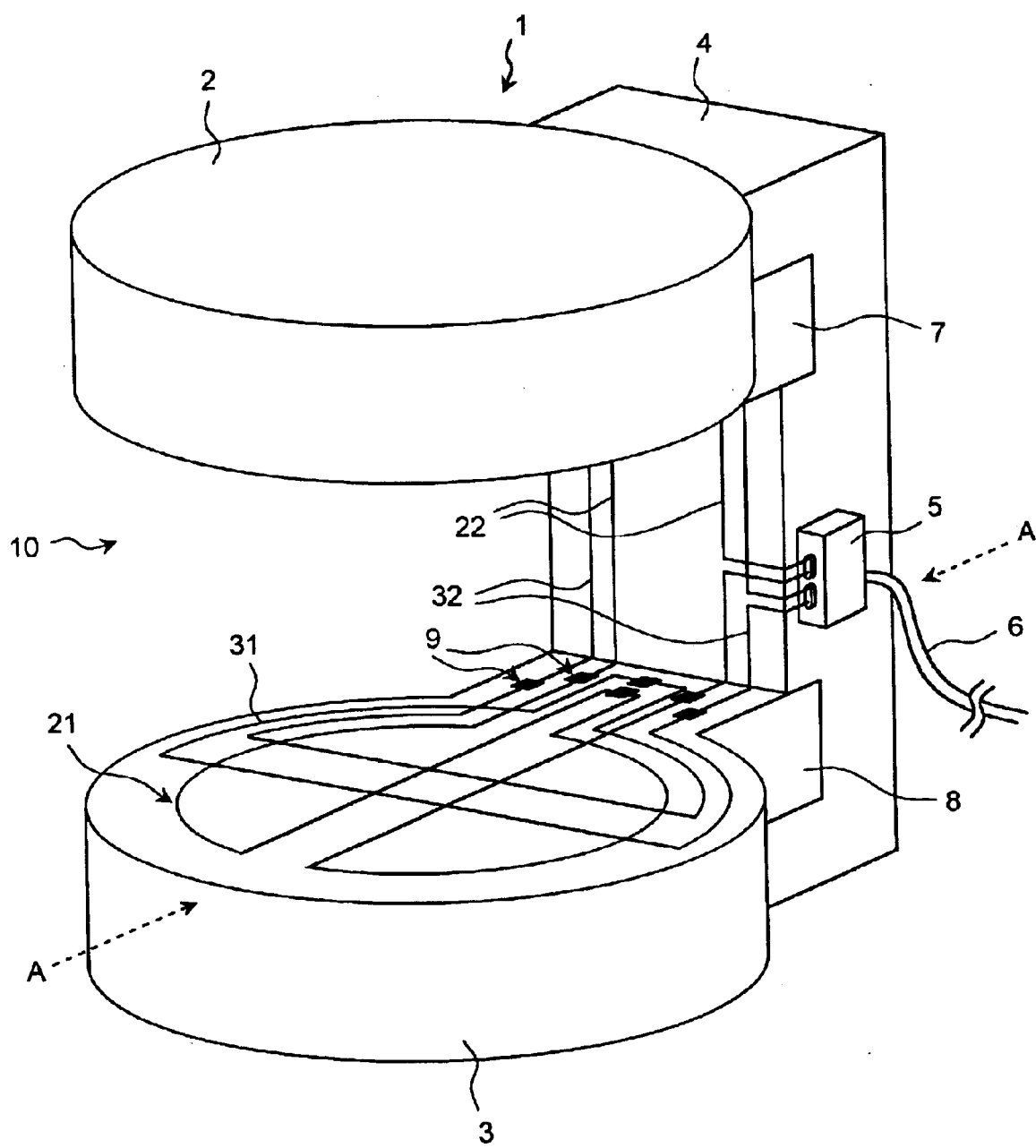
FIG. 1 is an explanatory diagram for explaining an overall configuration of an MRI apparatus in accordance with an embodiment of the present invention.
Figure 2:
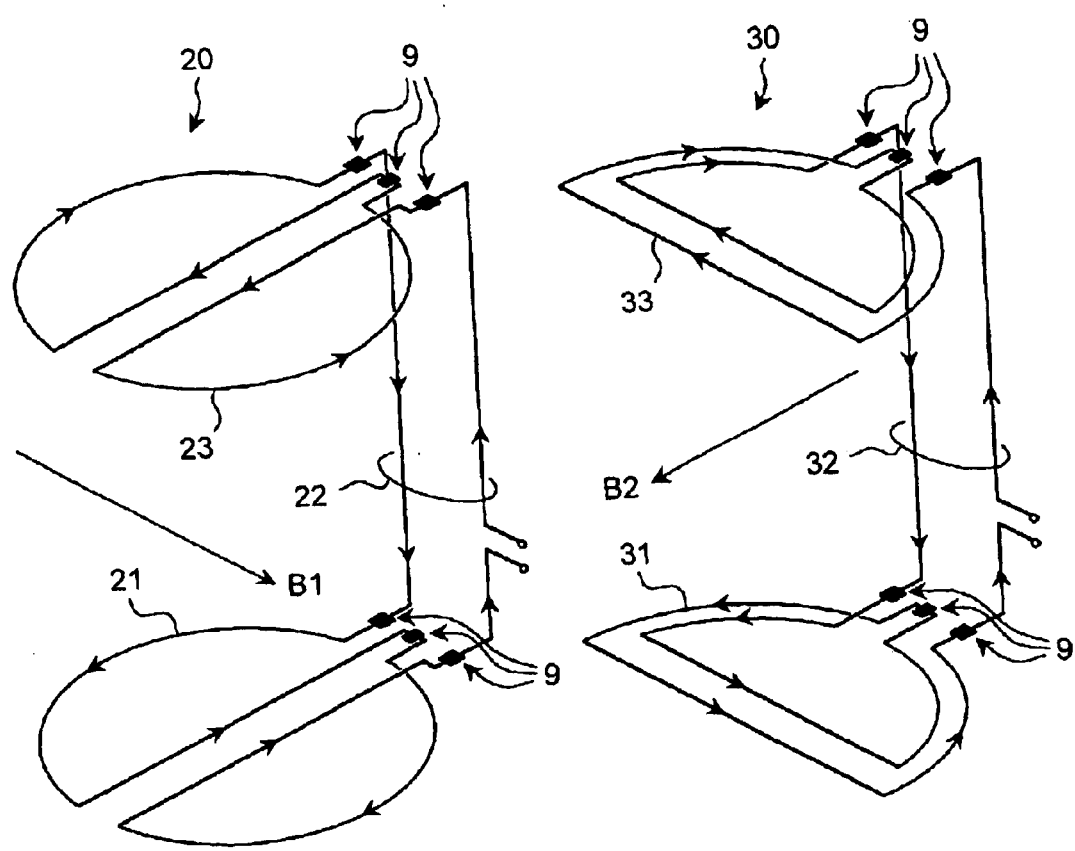
FIG. 2 is an explanatory diagram for explaining RF coils disposed in the MRI apparatus shown in FIG. 1.
Figure 3:
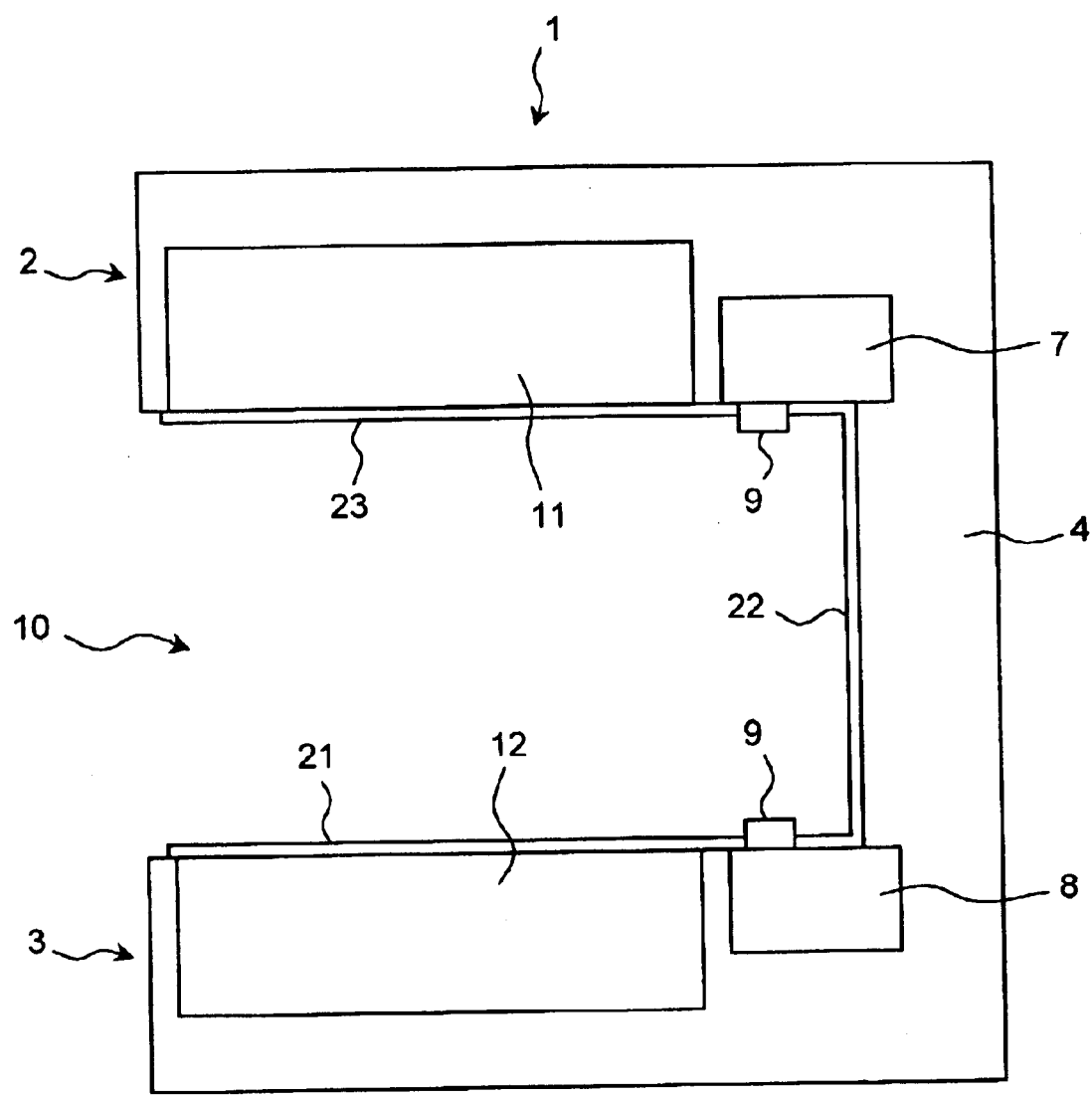
FIG. 3 is a vertical cross-sectional view of the MRI apparatus shown in FIG. 1 taken along line A—A.
Figure 4:
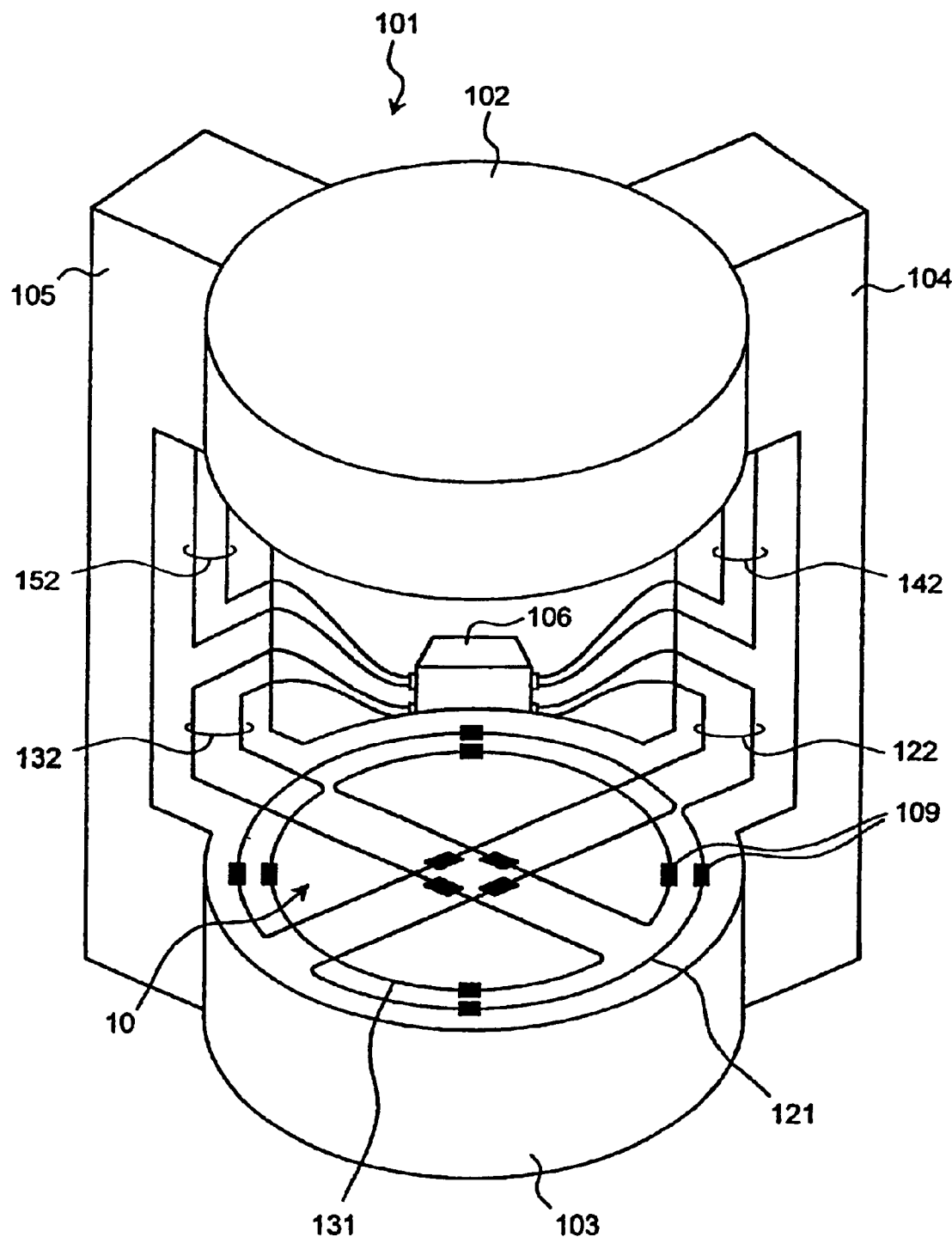
FIG. 4 is an explanatory diagram for explaining an overall configuration of an MRI apparatus in the prior art.
Figure 5:
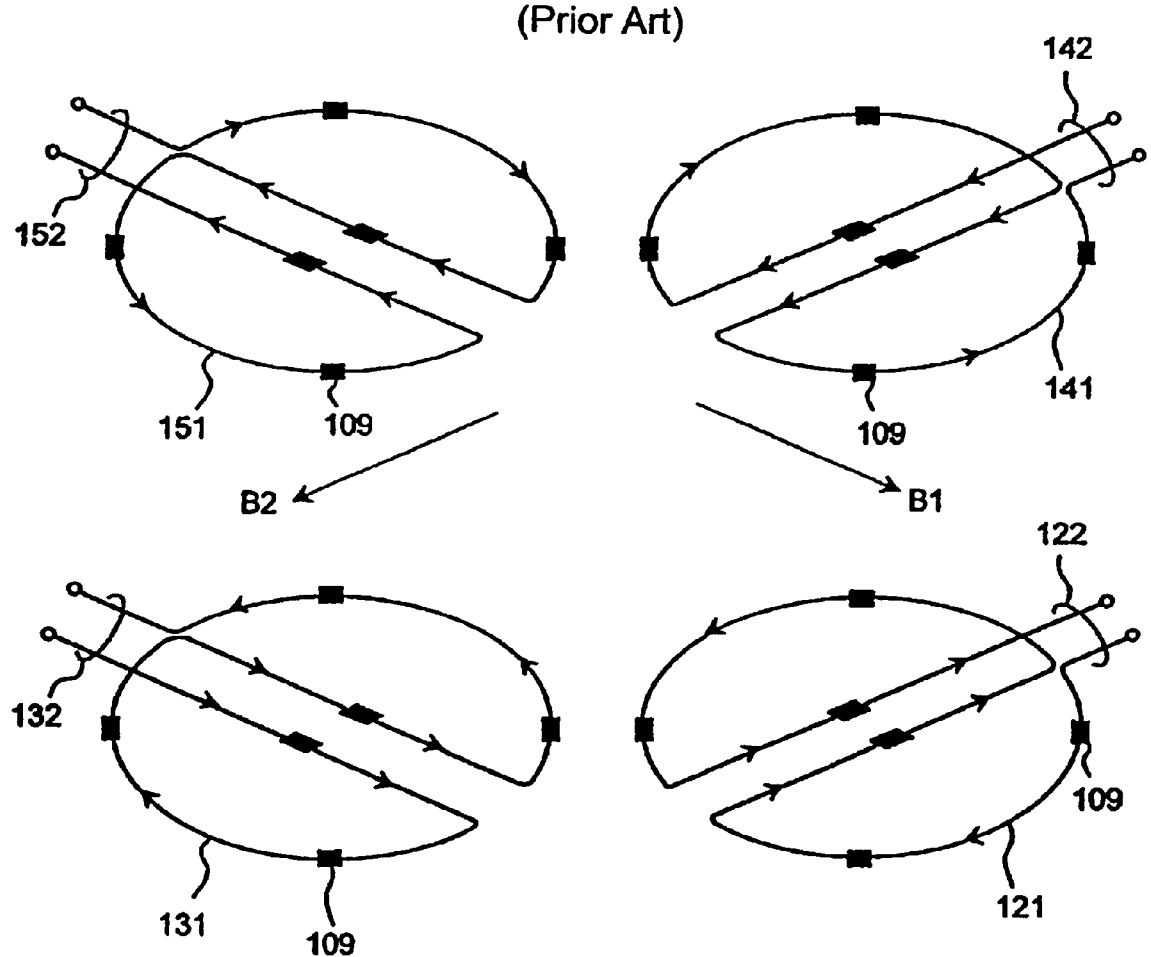
FIG. 5 is an explanatory diagram for explaining RF coils disposed in the MRI apparatus shown in FIG. 4.

FIG. 1 is an explanatory diagram for explaining the overall configuration of an MRI apparatus in accordance with the present embodiment, and FIG. 2 is an explanatory diagram for explaining RF coils disposed in the MRI apparatus shown in FIG. 1. FIG. 3 is a vertical cross-sectional view of the MRI apparatus shown in FIG. 1 taken along line A-A. In FIGS. 1, 2 and 3, the MRI apparatus 1 establishes an examination region 10 using a lower magnetic field generating section 3, which is a first magnetic field generating section, and an upper magnetic field generating section 2 supported by a post 4, disposed facing each other; and the MRI apparatus 1 generates a static magnetic field and a gradient magnetic field in the examination region 10 by an upper magnetic field coil 11 inside the upper magnetic field generating section 2 and a lower magnetic field coil 12 inside the lower magnetic field generating section 3. The upper magnetic field coil 11 is made by stacking an upper static magnetic field generating magnet for generating the static magnetic field, and an X-, Y- and Z-axis direction gradient magnetic field coils. Similarly, the lower magnetic field coil 12 is made by stacking a static magnetic field generating magnet for generating the static magnetic field, and an X-, Y- and Z-axis direction gradient magnetic field coils.

Moreover, a lower first-direction RF coil 21 that generates electromagnetic waves in a predefined direction (B1 direction hereinbelow) and a lower second-direction RF coil 31 that generates electromagnetic waves in a B2 direction orthogonal to the B1 direction are disposed on the upper surface of the lower magnetic field generating section 3. Similarly, an upper first-direction RF coil 23 that generates electromagnetic waves in the B1 direction, and an upper second-direction RF coil 33 that generates electromagnetic waves in the B2 direction are disposed on the lower surface of the upper magnetic field generating section 2. The lower first-direction RF coil 21 and the upper first-direction RF coil 23 are connected by RF wiring 22 to form a first-direction electromagnetic wave transmitting/receiving section 20. The lower second-direction RF coil 31 and the upper second-direction RF coil 33 are connected by RF wiring 32 to form a second-direction electromagnetic wave transmitting/receiving section 30. The first-direction electromagnetic wave transmitting/receiving section 20 and the second-direction electromagnetic wave transmitting/receiving section 30 emit electromagnetic waves of frequencies in a certain range toward the examination region 10, and receive electromagnetic waves radiated from atoms constituting a subject to be imaged by the nuclear magnetic resonance phenomenon.

The RF wiring 22 of the first-direction electromagnetic wave transmitting/receiving section 20 and the RF wiring 32 of the second-direction electromagnetic wave transmitting/receiving section 30 are connected to wiring 6 via a phase control section 5, and are supplied with electric power from the RF wiring 6 when transmitting electromagnetic waves, and send received electromagnetic waves via the RF wiring 6 when receiving electromagnetic waves. The phase control section 5 controls the phase of the first-direction electromagnetic wave transmitting/receiving section 20 and the second-direction electromagnetic wave transmitting/receiving section 30 to thereby control the phase of electromagnetic waves transmitted/received by the lower first-direction RF coil 21, lower second-direction RF coil 31, upper first-direction RF coil 23, and upper second-direction RF coil 33.

In the MRI apparatus 1, the first-direction electromagnetic wave transmitting/receiving section 20 generates an electromagnetic field in the B1 direction in the examination region 10, and the second-direction electromagnetic wave transmitting/receiving section 30 generates an electromagnetic field in the B2 direction. By thus generating electromagnetic fields in two orthogonal directions in the examination region 10, uniform electromagnetic waves can be generated inside the examination region 10 with high excitation efficiency, and also accuracy of reception of electromagnetic waves from the examination region 10 can be made uniform.

Additionally, the phase control section 5 controls the phase of electromagnetic waves to avoid coupling between electromagnetic waves in the B1 direction and those in the B2 direction. For example, by conducting control for differentiating the phase of electromagnetic waves in the B1 direction and the phase of electromagnetic waves in the B2 direction by 90°, coupling between the electromagnetic waves in the B1 direction and those in the B2 direction can be avoided. The phase control section 5 is implemented using a 2-channel phase control section because the phase of the two electromagnetic wave transmitting/receiving sections of the first-direction electromagnetic wave transmitting/receiving section 20 and the second-direction electromagnetic wave transmitting/receiving section 30 are controlled. Thus, the phase control section 5 has a simpler configuration than in conducting 4-channel phase control, and transmission and reception of electromagnetic waves can be stably achieved.

More detailed description will next be made on a process of disposing the lower first-direction RF coil 21, upper first-direction RF coil 23, lower second-direction RF coil 31 and upper second-direction RF coil 33. The lower first-direction RF coil 21, lower second-direction RF coil 31, upper first-direction RF coil 23 and upper second-direction RF coil 33 are each made by connecting a plurality of control devices with a coil element. The control devices 9 are for stabilizing the phase of the coil element, and for switching between transmission and reception of electromagnetic waves. In the MRI apparatus 1, the lower first-direction RF coil 21 is provided with the control devices disposed outside the examination region 10; and inside the examination region 10, only the coil element is disposed. Similarly, for the lower second-direction RF coil 31, upper first-direction RF coil 23, and upper second-direction RF coil 33, the control devices 9 are disposed outside the examination region 10; and inside the examination region 10, only the coil element is disposed.

Particularly, for the lower first-direction RF coil 21, a first control device 9 is provided immediately before the lower first-direction RF coil 21 is reached from the RF wiring 22 mounted along the post 4; and a next control device 9 is provided after running the coil element inside the examination region 10 and then drawing once the coil element outside the examination region 10. Furthermore, still another control device 9 is provided after running the coil element again inside the examination region 10 and then drawing the coil element outside the examination region 10. For the upper first-direction RF coil 23, a first control device 9 is provided immediately before the upper first-direction RF coil 23 is reached from the RF wiring 22 mounted along the post 4; and a next control device 9 is provided after running the coil element inside the examination region 10 and then drawing once the coil element outside the examination region 10. Furthermore, still another control device 9 is provided after running the coil element again inside the examination region 10 and then drawing the coil element outside the examination region 10.

Similarly, for the lower second-direction RF coil 31, a first control device 9 is provided immediately before the lower second-direction RF coil 31 is reached from the RF wiring 32 mounted along the post 4; and a next control device 9 is provided after running the coil element inside the examination region 10 and then drawing once the coil element outside the examination region 10. Furthermore, still another control device 9 is provided after running the coil element again inside the examination region 10 and then drawing the coil element outside the examination region 10. For the upper second-direction RF coil 33, a first control device 9 is provided immediately before the upper second-direction RF coil 33 is reached from the RF wiring 32; and a next control device 9 is provided after running the coil element inside the examination region 10 and then drawing once the coil element outside the examination region 10. Furthermore, still another control device 9 is provided after running the coil element again inside the examination region 10 and then drawing the coil element outside the examination region 10.

Thus, when the control devices 9 are disposed, the coil element is drawn outside the examination region 10 to dispose a control device 9, and then the coil element is run again inside the examination region 10, whereby the control devices 9 can be disposed only outside the examination region 10. Thus, there exists no control device 9 inside the examination region 10, and space of the examination region 10 can be expanded by the thickness of the control devices 9. Since the control devices 9 generally have a thickness of the order of 10 mm, the space of the examination region 10 can be expanded on the order of 20 mm in the vertical direction by disposing the control devices 9 outside the examination region 10. Moreover, the control devices can be kept away from the subject to be imaged by disposing the control devices 9 outside the examination region 10.

Furthermore, since the control devices 9 are disposed together outside the examination region 10, cooling of the control devices is facilitated. In the MRI apparatus 1, a cooling section 7 is provided near the upper magnetic field generating section 2 at the post 4, and a cooling section 8 is provided near the lower magnetic field generating section 3 at the post 4. By thus disposing the control devices 9 together, the need to distribute the cooling section is eliminated and cooling means can be provided outside the examination region 10. A large-scale cooling section can therefore be employed without reducing space of the examination region 10. In addition, since the MRI apparatus 1 supports the upper magnetic field generating section 2 by a single post 4 and the post 4 has therein the RF wiring 22 and, 32, phase control section 5, and cooling sections 7 and 8, the operator's accessibility to the examination region 10 is further improved.

As described above, in the MRI apparatus 1 in accordance with the present embodiment, the lower first-direction RF coil 21 and the upper first-direction RF coil 23 are connected to form the first-direction electromagnetic wave transmitting/receiving section 20, and the lower second-direction RF coil 31 and the upper second-direction RF coil 33 are connected to form the second-direction electromagnetic wave transmitting/receiving section 30, and therefore, the phase of electromagnetic waves in two orthogonal directions can be controlled by the 2-channel phase control section 5, whereby an RF system in which operation is stabilized with a simple configuration is achieved. Moreover, since the control devices for the RF coils are provided outside the examination region 10, the examination region 10 can be maximized; and since the control devices are disposed together, heat generated by the control devices is efficiently cooled.

In the preceding description, each RF coil in the MRI apparatus 1 is described as comprising two coil elements.

This is because even when the number of coil elements is two, it is possible to obtain desired electromagnetic waves by adjusting the width of the coil element and the distance between the coil elements. If three or more coil elements are present, an effect similar to that in the MRI apparatus 1 can be attained by repeatedly using the configuration of running a coil element inside the examination region and then drawing the coil element outside the examination region to dispose a control device.

Moreover, although electromagnetic waves in two directions are orthogonalized to achieve uniform accuracy of transmission and reception of electromagnetic waves in the examination region in the preceding description, the electromagnetic waves in the two directions need not necessarily be orthogonal to each other and electromagnetic waves forming any angle can be used.

The discussion and drawings regarding the present embodiment should not be understood as limiting the present invention. It is contemplated that several alternative embodiments, examples, and operation techniques will be apparent to those skilled in the art based on the above disclosure. For example, the subject to be imaged by the MRI apparatus is not limited to a human body in the present embodiment, and the purpose of use is not limited to the medical application. For example, the MRI apparatus in accordance with the present embodiment may be effectively used for non-destructive inspection on an object other than a human body.

Moreover, while the MRI apparatus shown in the present embodiment is of a so-called vertical magnetic field type that applies a static magnetic field in a vertical direction, the present invention may be applied to a so-called horizontal magnetic field type MRI apparatus that applies a static magnetic field in a horizontal direction.

Many widely different embodiments of the invention may be configured without departing from the spirit and the scope of the present invention. It should be understood that the present invention is not limited to the specific embodiments described in the specification, except as defined in the appended claims.

What is claimed is:

1. A magnetic resonance imaging apparatus in which an examination region is established by a first magnetic field generating section and a second magnetic field generating section disposed facing each other, and a magnetic resonance image of a subject placed within said examination region is captured, comprising:
    a first-direction electromagnetic wave transmitting/receiving section for transmitting/receiving electromagnetic waves in a predefined first direction inside said examination region, wherein said first-direction electromagnetic wave transmitting/receiving section includes a first first-direction RF coil and a second first-direction RF coil;
    a second-direction electromagnetic wave transmitting/receiving section for transmitting/receiving electromagnetic waves in a second direction different from said first direction inside said examination region, wherein said second-direction electromagnetic wave transmitting/receiving section includes a first second-direction RF coil and a second second-direction RF coil;
    a first RF wiring coupling said first first-direction RF coil with said second first-direction RF coil;
    a second RF wiring coupling said first second-direction RF coil with said second second-direction RF coil, wherein said first RF wiring and said second RF wiring are mounted along a post; and
    a phase control section for controlling the phase of electromagnetic waves transmitted/received by said first-direction electromagnetic wave transmitting/receiving section and the phase of electromagnetic waves transmitted/received by said second-direction electromagnetic wave transmitting/receiving section.

2. The magnetic resonance imaging apparatus of claim 1, wherein said first first-direction RF coil is provided near said first magnetic field generating section, said second first-direction RF coil is provided near said second magnetic field generating section, said first second-direction RF coil is provided near said first magnetic field generating section, and said second second-direction RF coil is provided near said second magnetic field generating section.

3. The magnetic resonance imaging apparatus of claim 1, wherein said first first-direction RF coil, said second first-direction RF coil, said first second-direction RF coil, and said second second-direction RF coil each comprises a plurality of control devices for stabilizing the phase in each coil and a coil element for connecting said plurality of control devices, and are each made by disposing said coil element inside said examination region and disposing said plurality of control devices outside said examination region.

4. The magnetic resonance imaging apparatus of claim 3, further comprising a cooling section near said plurality of control devices for cooling said plurality of control devices.

5. The magnetic resonance imaging apparatus of claim 4, wherein said cooling section is provided at said post.

6. The magnetic resonance imaging apparatus of claim 1, wherein said first direction and said second direction are orthogonal to each other.

7. The magnetic resonance imaging apparatus of claim 1, wherein said first magnetic field generating section is positioned near a floor, and said second magnetic field generating section is supported by said post.

8. The magnetic resonance imaging apparatus of claim 1, wherein said first direction and said second direction are parallel to the floor.

9. The magnetic resonance imaging apparatus of claim 1, wherein said phase control section is provided at said post.

10. A magnetic resonance imaging system comprising:
    a first magnetic field generator section facing a second magnetic field generator section to form an examination region between said first and second magnetic field generator sections;
    a first-direction section configured to communicate electromagnetic waves, wherein said first-direction section includes at least a first first-direction RF coil and a second first-direction RF coil;
    a second-direction section configured to communicate electromagnetic waves, wherein said second-direction section includes at least a first second-direction RF coil and a second second-direction RF coil, wherein said first first-direction, said second first-direction, said first second-direction, and said second second-direction RF coils include at least one control device, said at least one control device configured to stabilize phases within said first first-direction, said second first-direction, said first second-direction, and said second second-direction RF coils, and said at least one control device located outside the examination region.

11. The magnetic resonance imaging system of claim 10 further comprising at least one cooling section configured to cool said at least one control device and located outside the examination region.

* * * * *